SENSOR DEVICE AND METHOD OF MOUNTING

Filed March 16, 1961

INVENTOR
Arthur J. Hodges
Rafael Landron, Jr.
BY Stevens, Davis, Miller & Mosher
ATTORNEYS 3,250,963
Patented May 10, 1966

3,250,963
SENSOR DEVICE AND METHOD OF MOUNTING

Arthur J. Hodges, Dallas, and Rafael Landron, Jr., Richardson, Tex., assignors to Texas Instruments Incorporated, Dallas, Tex., a corporation of Delaware Filed Mar. 16, 1961, Ser. No. 96,318
4 Claims. (Cl. 317—234)

This invention relates to semiconductor devices and more particularly to a sensor device and method of mounting the same.

Heretofore in the mounting of the sensor element of minute semiconductor devices of the type being considered wherein the sensor wafer or crystal element is extremely small and has dimensions in the range of thousandths of an inch, the metallic means that provide appropriate electrical connections and for mounting the sensor crystal rigidly in position have heretofore been characterized by the presence of minute projecting portions that, even though very small in size, nevertheless, sometimes due to misalignment, poor assembly, etc., have a tendency to produce electrical shorting within the device when the metallic casing or can is mounted on the entire semiconductor assembly.

Another difficulty has been experienced in the assembly of the sensor device when encapsuled in a "Kovar" metallic can after the electrical leads are soldered or brazed to the sensor crystal. The difficulty occurs when the metallic can is fused to the sensor device and the transparent glass window is also fused in the top of the "Kovar" can by a process involving induction heating at a temperature of 1000° C. This heat, even though remote from the wafer or crystal and largely confined to the metal of the can, is actually sufficient to soften or melt the previously soldered joints of the leads to the wafer, tending toward serious and critical damage to the device.

The present invention provides a construction and method of mounting that obviates these difficulties and disadvantages and wherein the mounting of the sensor device is simplified, effectively resulting in a device that is stronger, sturdier and more dependable in use.

Accordingly, it is an object of the invention to provide a simplified sensor mounting wherein the connection of the electrical leads to the crystal is free of any undesirable protuberances or projections.

Another object is to provide a sensor mounting wherein the partially resilient electrical leads to the sensor crystal are bent to resiliently but firmly engage opposite substantially flat surfaces of the crystal and thereby directly support and position the crystal regardless of soldered connections.

Another object is to provide a sensor mounting wherein the partially resilient electrical leads to the sensor crystal are angularly bent as to resiliently but firmly press against the opposed upper and lower surfaces of the crystal to provide a rigid support therefor at all times regardless of its soldered connections.

A further object is to provide a sensor mounting that has no lateral protuberances or projections extending beyond the outer unbroken surfaces of the electrical lead elements.

A still further object is the provision of a novel method of mounting a sensor device of any type or form and which is productive of a sturdy, strong and dependable device free of any electrical shorting or other defect chargeable to its structural mounting characteristics.

Other and more detailed objects of the invention will be apparent from the following description which, taken in connection with the accompanying drawings, discloses a preferred embodiment thereof.

Figure 1:
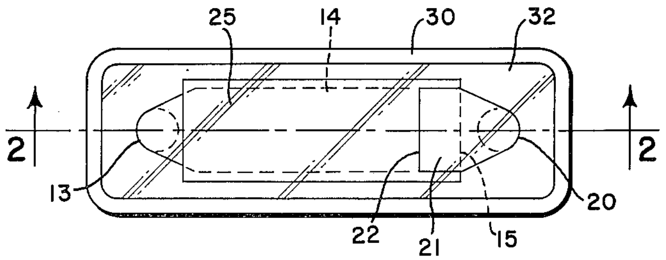
FIGURE 1 is a plan view of the assembled sensor device or unit.

As illustrated, the sensor device comprises a dielectric and insulating base or support member 10 having parallel upper and lower faces 11 and 12 and constructed of a material such as glass or the like, and which, while it may be of any desired shape in plan, is herein shown as generally rectangular. Fixedly extending through support member 10 in a direction normal to the surfaces 11, 12 thereof and in spaced and parallel relation to each other are two metallic "Kovar" partially resilient electrical leads 13 and 20. The relatively long upper end portion of lead 13 is bent and flattened at 14 into a generally rectangular shape, as shown in FIGURE 1, and disposed at a relatively short distance above the support member so as to be initially at an angle slightly greater than 90° relative to the major portion of lead 13 and at a slightly acute angle to surface 11 of the support member, as indicated in dashed lines in FIGURE 2. The terminal end 15 of the relatively long flattened lead portion 14 is disposed relatively close to but spaced from the other lead 20. The relatively short upper end of lead 20, likewise flattened at 21 in a manner corresponding to portion 14 of lead 13, is bent at right angle to the major portion thereof and parallel to upper surface 11 of member 10 to form a relatively short and therefore more rigid lead terminal 21 which, with its free end 22, extends in a direction toward and in overlapping relation to the terminal end 15 of flattened portion 14 of lead 13 and disposed in predetermined vertically spaced relation thereto.

Figure 2:
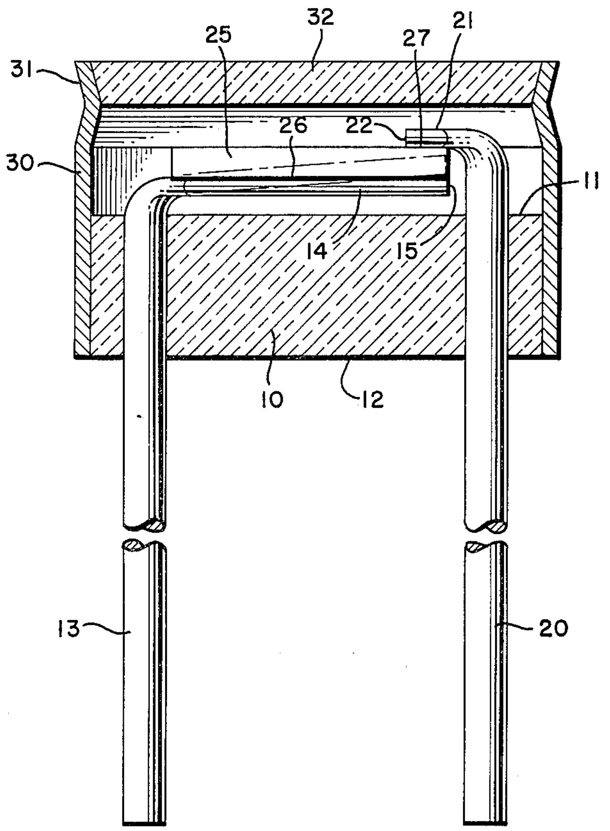
FIGURE 2 is a longitudinal sectional view taken through the device on line 2—2 in FIGURE 1.

Rigidly mounted on and between the partially resilient flat terminal end portions 14 and 21 of electrical leads 13 and 20, respectively, is a silicon crystal, wafer, or the like 25. The silicon crystal or semiconductor wafer 25, which has flat and parallel upper and lower sides as shown in FIGURE 2, is of rectangular configuration slightly larger in width than the rectangular flattened end portions 14 and 21 of the leads 13 and 20 and is of a thickness corresponding to the vertical width of the space between the terminal portions 14 and 21 when these portions are sprung apart to lie parallel to each other.

Silicon crystal 25 is mounted onto its electrical terminals 14, 21 by first deflecting the free end 15 of the lower and longer end portion 14 toward surface 11 of the glass mounting insulator 10 by manual pressure sufficient to permit the crystal to be positioned symmetrically on lead 14, as shown in FIGURE 1, and for the right-hand end of the crystal (FIGURE 2) to be located in alignment with the end 15 of end portion 14. The downwardly applied manual pressure on lead end portion 14 is then released. The release of this pressure permits the end portion 14 to spring upwardly to thereby press the right-hand end of the crystal 25 into engagement with flattened end 21 of lead 20 so as to be frictionally and firmly held in fixed position between the overlapped portions of the terminals by the resilient pressure of end terminal 14. When the crystal is so mounted the flattened end terminal portion 14 is then disposed substantially parallel to upper surface 11 of the terminal-supporting glass member 10.

This firm mechanical holding of crystal 25 due to the resilient spring pressure between the overlapped portions of the terminals 14, 21 enables the crystal to be carefully pre-aligned in position and firmly held against any undesirable shifting movement. The crystal, while so held, is then electrically and more permanently connected to the terminal end portions 14 and 21 by soldering or brazing at the surfaces or joints 26, 27 in a manner well known in the art.

A metallic can 30, constructed of "Kovar" of a size to snugly fit at one end thereof in frictional supporting engagement around the outer periphery of the dielectric glass mounting member 10, is then accordingly so positioned, as shown on the drawings, so as to extend upwardly in surrounding relationship to the semiconductor structure including the crystal and its supporting structure.

The upper end of the can 30 is outwardly flared at 31, as clearly shown in FIGURE 2, to receive a complementary shaped glass window 32 the top surface of which is disposed flush with the upper edge of the can. With provision made for a proper gaseous environment within the sensor device, the can 30 is then fused onto the glass mounting member 10, the window 32 also being fused within the housing flared portion 31, by a process of electrical inductive heating well known in the art. This is possible since it is well known that "Kovar" metal has a coefficient of expansion similar to glass and readily fuses therewith. Since this fusing process produces a temperature of approximately 1000° C. it is actually sufficient to melt or soften the previously soldered joints 26 and 27 between the sensor crystal 25 and terminal portions 14 and 21, respectively, even though this heat is relatively remote with respect to the crystal and largely confined to the "Kovar" metal of the can 30 by the inductive heating process. However, should this melting condition obtain, no damage to the device occurs, since the sensor crystal 25, aside from its soldered connections, is still mechanically held and maintained rigidly in fixed, predetermined position by the resilient action of the terminal end portions 14 and 21; the solder of the joints 26, 27 merely rehardening as soon as the high-temperature heating is ended.

The term of "Kovar" as used throughout this specification is a trade name of Westinghouse Electric Corporation and identifies their specific iron-nickel-cobalt alloy which has a coefficient of thermal expansion which corresponds to certain glasses used in the product of this invention, namely, Corning Glass Works No. 7052 clear glass and 7052 sintered glass ("Multiform"). "Multiform" comprises a sintered glass composition of approximately 64% $SiO_2$, 2.5% $Na_2O$, 3.5% $K_2O$, 1% $Li_2O$, 3% BaO, 19% $B_2O_3$ and 7% $Al_2O_3$. The proportion of the elements named in the "Kovar" metal is approximately 29% Ni, 17% Co and the balance predominately iron, but including a very small amount of Mn, Si, C, Al, Mg, Zr, and Ti. This alloy metal, as used in leads 13 and 20, may be soldered to the silicon wafer by a solder composed of approximately 5% indium and the balance lead; this solder composition has a melting point of approximately 315° C. Other proportions of In may be used, but the melting point tends to be lowered as the percentage of In is increased.

During the process step of inductively fusing the "Kovar" metal can to the glass, the wafer is inverted so that the solder nearest the heated surface is on the side of the wafer facing up during that particular step.

Having disclosed the principles of our invention in connection with a specific embodiment thereof it is to be clearly understood that this description is made by way of example only and not as a limitation in the scope of the invention as set forth in the accompanying claims.

What is claimed is:

1. A sensor mounting for semiconductor devices comprising, a dielectric and insulator mounting means, substantially parallel and spaced metallic electrical terminal leads having end portions fixedly mounted in and extending through opposite sides of said insulator mounting means, a sensor wafer means having a pair of substantially parallel, flat sides, said extended end portions of said terminal leads at one side of said insulator means being of differential length and bent in overlying relation to said insulator mounting means and in overlapping relation, the longer one of said pair of bent lead end portions underlying and resiliently engaging one of the said flat sides of said sensor wafer means and supporting said sensor wafer means with the opposite flat side of said sensor wafer means fixed in firm frictional engagement with the overlapped portion of the other one of said pair of lead bent end portions, said lead bent end portions being solder-connected to said sensor wafer means.

2. A sensor mounting comprising insulator mounting means, spaced electrical lead means having terminal end portions fixedly mounted in and extending to one side of said insulator mounting means, a sensor crystal unit, said extended terminal end portions of said spaced electrical lead means being bent to resiliently and frictionally engage opposite sides of said sensor crystal unit in fixed supporting relation, said bent terminal end portions of said spaced electrical lead means being flattened and engaging correspondingly-shaped, substantially parallel, opposite surfaces of said sensor crystal, said bent terminal portions being of differential length and disposed in overlapping relation, the longer one of said bent terminal end portions underlying and resiliently supporting said sensor crystal unit in frictional positioning engagement with the overlapped portion of the other of said bent terminal end portions, said terminal end portions of said electrical lead means being also solder-connected to said sensor crystal unit.

3. A method of mounting a semiconductor device comprising the steps of flattening the ends of a plurality of metallic rod-like elements, fusing said metallic rod-like elements in spaced relation in an insulating support member, bending the flattened ends of said rod-like elements into overlapping relation to form a small acute angle therebetween, springing the flattened ends apart to receive a sensor element therebetween, releasing the flattened ends to resiliently grip and hold a sensor element therebetween, soldering the leads to the sensor element while said element is held in position by said flattened ends, snugly fitting an open-ended metal enclosing can around said insulating support member, inserting a transparent window in the end of said can and fusing the can and window in place by inductive electric heating, the soldered connections softening while the inductive heating is applied but solidifying without damage after the inductive heating is removed.

4. A method of mounting a semiconductor device including the steps of fusing a pair of partially resilient wires in spaced parallel relation in a glass insulating mounting block with the ends projecting therethrough, deforming the projecting ends of the wires thereby forming contact surfaces, bending the projecting wire ends into a clamping and holding disposition, deflecting said wire ends apart, inserting a semiconductor element between the wire ends, releasing the wire ends to resiliently clamp and hold the semiconductor element therebetween, soldering said wire ends to the semiconductor element therebetween, soldering said wire ends to the semiconductor element while said wire ends are clamping and holding the semiconductor element in soldering position, snugly fitting a metallic enclosure about the glass insulating member and semiconductor element mounted thereon, inductively heating the enclosure to fuse it to the glass insulating mounting block, the inductive heating melting the soldered connections between the wire ends and semiconductor element while the wire ends are resiliently clamping and holding the semiconductor element rigidly in position and terminating the inductive heating, thereby causing the soldered connections to solidify without damage to the semiconductor device.

References Cited by the Examiner

UNITED STATES PATENTS

| | | | |
|---|---|---|---|
| 2,757,792 | 8/1956 | Shioleno | 317—242 |
| 2,796,563 | 6/1957 | Ebers | 317—235 |
| 2,817,046 | 12/1957 | Weiss | 317—234 |
| 2,842,831 | 7/1958 | Pfann | 317—235 |
| 2,862,160 | 11/1958 | Ross | 317—235 |
| 2,887,628 | 5/1959 | Zierdt | 317—234 |
| 2,981,875 | 4/1961 | Kelley | 317—235 |
| 3,108,209 | 10/1963 | Knowles | 317—235 |

JOHN W. HUCKERT, *Primary Examiner.*

J. D. KALLAM, *Assistant Examiner.*